United States Patent
Shao et al.

(10) Patent No.: US 12,470,204 B2
(45) Date of Patent: Nov. 11, 2025

(54) ENTROPY SOURCE CIRCUIT AND ENTROPY VALUE GENERATION METHOD

(71) Applicant: PUFsecurity Corporation, Hsinchu County (TW)

(72) Inventors: Chi-Yi Shao, Hsinchu County (TW); Kai-Hsin Chuang, Hsinchu County (TW); Meng-Yi Wu, Hsinchu County (TW)

(73) Assignee: PUFsecurity Corporation, Hsinchu County (TW)

( * ) Notice: Subject to any disclaimer, the term of this patent is extended or adjusted under 35 U.S.C. 154(b) by 201 days.

(21) Appl. No.: 18/219,082

(22) Filed: Jul. 6, 2023

(65) Prior Publication Data
US 2024/0072776 A1  Feb. 29, 2024

(30) Foreign Application Priority Data
Aug. 26, 2022 (TW) .................................. 111132291

(51) Int. Cl.
*H03K 3/03* (2006.01)
*H03K 5/00* (2006.01)
(Continued)

(52) U.S. Cl.
CPC ............. *H03K 3/0315* (2013.01); *H03K 5/01* (2013.01); *H03K 17/6871* (2013.01); *H03K 19/21* (2013.01); *H03K 2005/00013* (2013.01)

(58) Field of Classification Search
CPC .... H03K 3/0315; H03K 5/01; H03K 17/6871; H03K 19/21; H04L 9/3278
See application file for complete search history.

(56) References Cited

U.S. PATENT DOCUMENTS 5,963,104 A * 10/1999 Buer .......................... G06F 7/58
                                                              708/250
8,791,764 B2 * 7/2014 Shin ...................... H03L 7/0995
                                                              327/156
(Continued)

FOREIGN PATENT DOCUMENTS

CN      101819515 A    9/2010
CN      108363562 A    8/2018
(Continued)

OTHER PUBLICATIONS

John Kelsey, "SP 800-90B Overview", May 2016, NIST, https://csrc.nist.gov/csrc/media/events/random-bit-generation-workshop-2016/documents/presentations/session-i-1-john-kelsey-presentation.pdf, accessed Mar. 14, 2025. (Year: 2016).*

*Primary Examiner* — Menatoallah Youssef
*Assistant Examiner* — Colleen J O Toole
(74) *Attorney, Agent, or Firm* — Winston Hsu

(57) ABSTRACT

An entropy source circuit, comprising: a first adjustable ring oscillator for operating under a first setting or a second setting according to a first control signal, for respectively generating a first oscillation clock signal and a second oscillation clock signal which have different frequencies under the first setting and the second setting; a first sampling circuit, for sampling the first oscillating clock signal according to the sampling frequency to generate first sampling values, or sampling the second oscillating clock signal according to the sampling frequency to generate second sampling values; a first detection circuit detecting a first distribution of the first sampling values; and a control circuit generating the first control signal to switch the first setting to the second setting when the first distribution does not meet a predetermined distribution. The entropy source cir-
(Continued)

cuit outputs entropy values according to the first sample value or the second sample value.

14 Claims, 9 Drawing Sheets

(51) Int. Cl.
  *H03K 5/01* (2006.01)
  *H03K 17/687* (2006.01)
  *H03K 19/21* (2006.01)

(56) References Cited

U.S. PATENT DOCUMENTS

| | | | |
|---|---|---|---|
| 11,301,215 B2* | 4/2022 | Lamb | G06F 7/5057 |
| 2009/0157782 A1 | 6/2009 | Lin | |
| 2010/0332574 A1* | 12/2010 | Herbert | G06F 9/30007 |
| | | | 708/250 |
| 2014/0164458 A1 | 6/2014 | Tkacik | |
| 2014/0201851 A1 | 7/2014 | Guo | |
| 2014/0244702 A1 | 8/2014 | Karpinskyy | |
| 2017/0048061 A1 | 2/2017 | Bohdan | |
| 2020/0278839 A1* | 9/2020 | Chang | G06F 7/588 |

FOREIGN PATENT DOCUMENTS

| | | | | |
|---|---|---|---|---|
| JP | 2015-102981 A | 6/2015 | | |
| JP | 2018-507468 A | 3/2018 | | |
| JP | 2019-531541 A | 10/2019 | | |
| JP | 2020-119562 A | 8/2020 | | |
| WO | WO-2014113255 A1 * | 7/2014 | | G06F 1/26 |

* cited by examiner

ENTROPY SOURCE CIRCUIT AND ENTROPY VALUE GENERATION METHOD

BACKGROUND OF THE INVENTION

1. Field of the Invention

The present invention relates to an entropy source circuit and an entropy value generation method, and particularly relates to an entropy source circuit and an entropy value generation method which can dynamically adjust signal parameters to generate entropy values with better qualities.

2. Description of the Prior Art

An entropy source circuit is configured to generate random entropy values which can be used for encryption or as passwords. However, entropy values with poor qualities may be generated if the signal parameters for the entropy source circuit are not properly set. However, a conventional entropy source circuit always has no mechanism for dynamically compensating such problem.

SUMMARY OF THE INVENTION

One objective of the present invention is to provide an entropy source circuit which can dynamically adjust signal parameters to generate entropy values with better qualities.

Another objective of the present invention is to provide entropy value generation method which can dynamically adjust signal parameters to generate entropy values with better qualities.

One embodiment of the present invention discloses an entropy source circuit, comprising: a first adjustable ring oscillator, configured to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies; a first sampling circuit, configured to sample the first oscillating clock signal by a sampling frequency to generate a plurality of first sampling values, and configured to sample the second oscillating clock signal by the sampling frequency to generate a plurality of second sampling values; a first detection circuit, configured to detect a first distribution of the first sampling values; and a control circuit, configured to determine if a setting of the first adjustable ring oscillator should be changed according to the first distribution, wherein the control circuit generates the first control signal to switch the first setting to the second setting when the first distribution does not meet a predetermined distribution condition; wherein the entropy source circuit outputs entropy values according to the first sampling values or the second sampling values.

Another embodiment of the present invention discloses an entropy source circuit, comprising: a first adjustable ring oscillator, configured to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies; a first sampling circuit, configured to sample the first oscillating clock signal by a sampling frequency to generate a plurality of first sampling values, and configured to sample the second oscillating clock signal by the sampling frequency to generate a plurality of second sampling values; a third detection circuit, configured to detect a first operation voltage or a first temperature of the entropy source circuit; a control circuit, configured to determine if a setting of the first adjustable ring oscillator should be changed from the first setting to the second setting according to the first operation voltage or the first temperature; wherein the entropy source circuit outputs entropy values according to the first sampling values or the second sampling values.

Still another embodiment of the present invention discloses: an entropy value generation method, applied to an entropy source circuit, comprising: controlling a first adjustable ring oscillator to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies; sampling the first oscillating clock signal by a sampling frequency to generate a plurality of first sampling values, and sampling the second oscillating clock signal by the sampling frequency to generate a plurality of second sampling values; detecting a distribution of the first sampling values; determining if a setting of the first adjustable ring oscillator should be changed according to the distribution, where in the first setting is switched to the second setting when the distribution does not meet a predetermined distribution; and outputting entropy values according to the first sampling values or the second sampling values by the entropy source circuit.

In view of above-mentioned embodiments, the entropy source circuit and the entropy value generation method provided by the present invention can dynamically change the frequency of the oscillating clock signal to ensure that entropy values with better qualities can be generated at any time.

These and other objectives of the present invention will no doubt become obvious to those of ordinary skill in the art after reading the following detailed description of the preferred embodiment that is illustrated in the various figures and drawings.

DETAILED DESCRIPTION

In the following descriptions, several embodiments are provided to explain the concept of the present application. It will be appreciated that the system, the device, the apparatus or the module depicted in following embodiments can be implemented by hardware (ex. circuit) or the combination of hardware and software (ex. a processing unit executing at least one program). The term "first", "second", "third" in following descriptions are only for the purpose of distinguishing different one elements, and do not mean the sequence of the elements.

Figure 1:
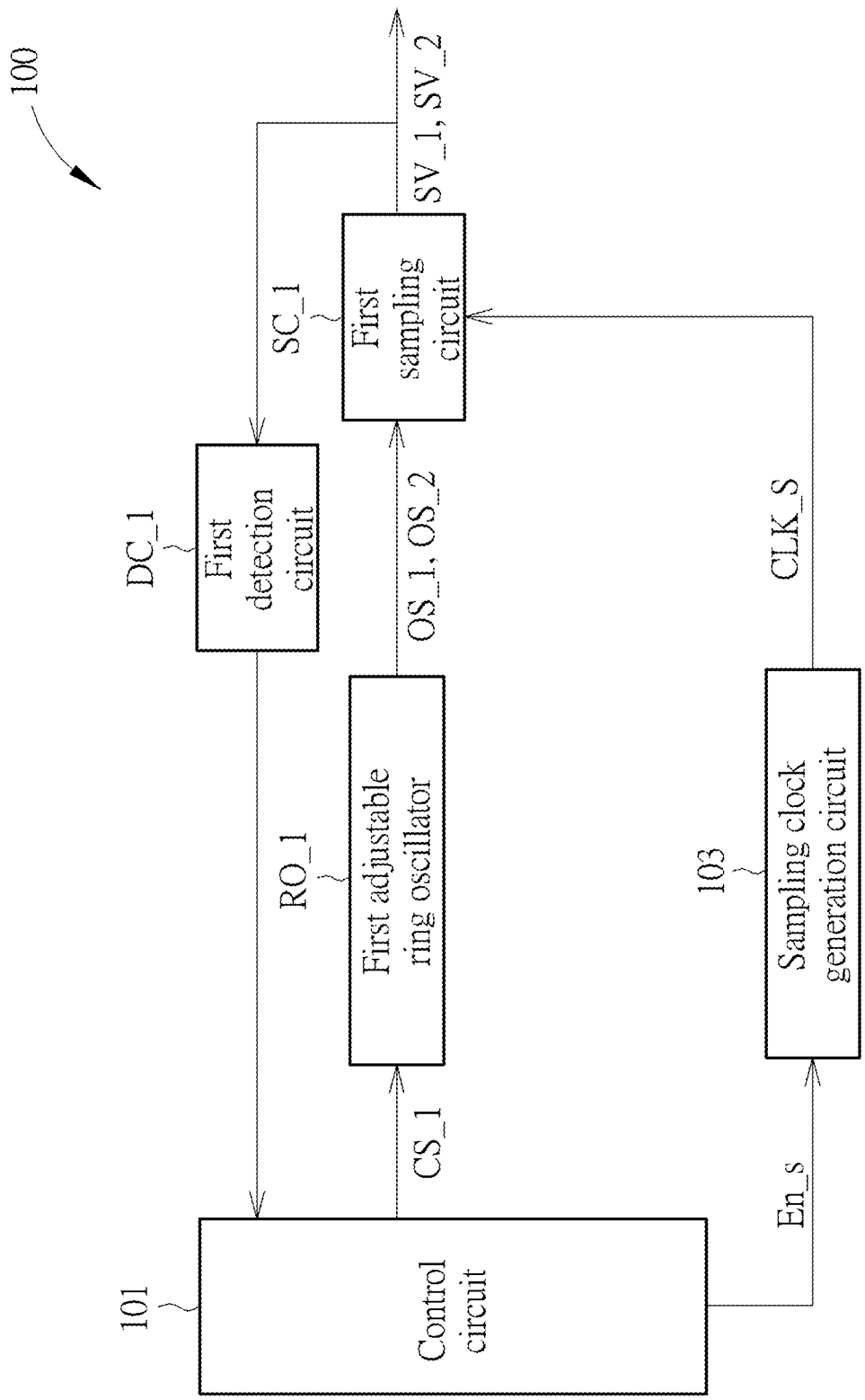
FIG. 1 and FIG. 2 are block diagrams illustrating entropy source circuits according to different embodiments of the present invention.

FIG. 1 is a block diagrams illustrating an entropy source circuit according to one embodiment of the present invention. As shown in FIG. 1, the entropy source circuit 100 comprises a control circuit 101, a sampling clock generation circuit 103, a first adjustable ring oscillator RO_1, a first sampling circuit SC_1 and a first detection circuit DC_1. The control circuit 101 is coupled to the first detection circuit DC_1, the first adjustable ring oscillator RO_1 and the sampling clock generation circuit 103. The first sampling circuit SC_1 is coupled to the first detection circuit DC_1, the first adjustable ring oscillator RO_1 and the sampling clock generation circuit 103.

The first adjustable ring oscillator RO_1 operates under a first setting or a second setting according to the first control signal CS_1. The first adjustable ring oscillator RO_1 generates a first oscillation clock signal OS_1 under the first setting, and generates a second oscillating clock signal OS_2 under the second setting. The first oscillating clock signal OS_1 and the second oscillating clock signal OS_2 have different frequencies. The first sampling circuit SC_1 samples the first oscillating clock signal OS_1 by a sampling frequency to generate a plurality of first sampling values SV_1, and samples the second oscillating clock signal OS_2 by the same sampling frequency to generate a plurality of second sampling values SV_2. The entropy source circuit 100 generates/outputs a first entropy value according to the first sample value SV_1 or generates/outputs a second entropy value according to the second sample values SV_2.

In other words, the control circuit 101 can dynamically adjust the setting of the first adjustable ring oscillator RO_1 via the first control signal CS_1, so that the first adjustable ring oscillator RO_1 can generate the oscillation clock signals OS_1, OS_2 with different frequencies. The first sampling circuit SC_1 samples the oscillating clock signals OS_1 and OS_2 which have different frequencies at the same sampling frequency, so different parts of the oscillating clock signals OS_1 and OS_2 may be sampled to generate different sampling values. The entropy source circuit 100 generates entropy values according to these different sampling values, so entropy values with different change rates can be obtained. Details about the change of the sampling values, the setting of the first adjustable ring oscillator RO_1 and how to generate the entropy values will be described in following descriptions. However, please note that although two settings are described in the embodiment of FIG. 1, the first adjustable ring oscillator RO_1 may have more than two settings.

The control circuit 101 can determine which setting should be used for the first the first adjustable ring oscillator RO_1 in various ways. Please refer to FIG. 1 again. The first detection circuit DC_1 in FIG. 1 detects the first distribution of the first sample values SV_1, and then the control circuit 101 can determine if a setting of the first adjustable ring oscillator RO_1 should be changed according to the first distribution. For example, if the adjustable ring oscillator RO_1 originally operates under the first setting, when the first distribution does not meet a predetermined distribution condition, the control circuit 101 generates the first control signal 101 so that the operation of the adjustable ring oscillator RO_1 is switched from the first setting to the second setting. The first distribution here may be: a number of a specific logic value in the first sampling values SV_1 within a predetermined time. For example, the number means how many logic values 1 are in the first sample value SV_1 within the predetermined time. The first distribution may also be the change rate of the first sample values SV_1, such as how many times a logic value 0 in the first sample value SV_1 transits to a logic value 1 within a predetermined time, or how many times a logic value 1 in the first sample value SV_1 transits to a logic value 0 within the predetermined time. The first distribution may also be a ratio of the number of different logic values in the first sample values SV_1, for example, the ratio of the number of the logic value 1 and the number of the logic value 0 in the first sample values SV_1 within a predetermined time.

In one embodiment, the entropy source circuit 100 follows the NIST SP800-90B standard, and uses the Repetition Count Test or the Adaptive Proportion Test in NIST SP800-90B to calculate the first distribution. However, please note that the entropy source circuit 100 provided in the present invention can use other calculation methods to calculate the first distribution of sampling values. In addition, although the above-mentioned embodiment is described with the first sample value SV_1, it does not mean to limit the scope of the present invention. When the present invention comprises a plurality of adjustable ring oscillators, the setting of a specific adjustable ring oscillator among the plurality of adjustable ring oscillators can be adjusted according to the sampling values corresponding to the specific adjustable ring oscillator.

Figure 2:
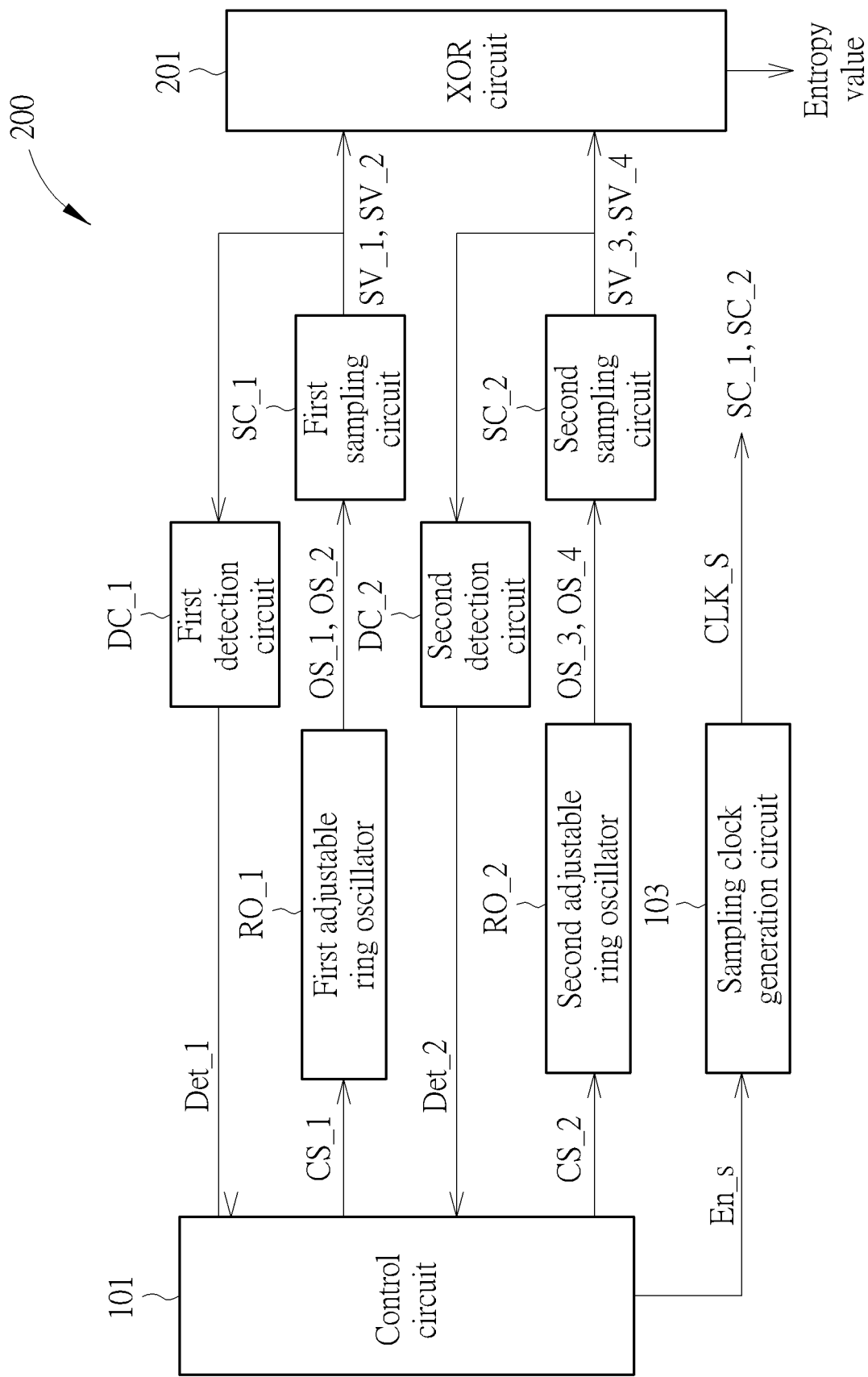

An example of how to generate the entropy values according to the sample values corresponding to the adjustable ring oscillator will be described below. FIG. 2 is a block diagrams illustrating an entropy source circuit 200 according to another embodiment of the present invention. In the embodiment of FIG. 2, in addition to the components and connection relationships thereof shown in FIG. 1, the entropy source circuit 200 further comprises a second detection circuit DC_2, a second adjustable ring oscillator RO_2, a second sampling circuit SC_2 and an XOR circuit 201. The control circuit 101 is coupled to the second detection circuit DC_2 and the second adjustable ring oscillator RO_2. The second sampling circuit SC_2 is coupled to the second detection circuit DC_2, the second adjustable ring oscillator RO_2 and the sampling clock generation circuit 103. The XOR circuit 201 is coupled to the first sampling circuit SC_1 and the second sampling circuit SC_2.

The second adjustable ring oscillator RO_2 operates under a third setting or a fourth setting according to the second control signal CS_2. The second adjustable ring oscillator RO_2 generates a third oscillation clock signal OS_3 under the third setting and generates a fourth oscillating clock signal OS_4 under the fourth setting. The third oscillating clock signal OS_3 and the fourth oscillating clock signal OS_4 have different frequencies. The second sampling circuit SC_2 samples the third oscillating clock signal OS_3 at the sampling frequency of the sampling clock signal CLK_S to generate third sampling values SV_3, and samples the fourth oscillating clock signal at the sampling frequency of the sampling clock signal CLK_S to generate fourth sample values SV_4. The XOR circuit 201 is configured to receive the outputs of the first sampling circuit SC_1 and the second sampling circuit SC_2 to generate entropy values. The entropy source circuit 200 may further comprise a second detection circuit DC_2 to detect a second distribution of the output of the second sampling circuit SC_2. The operation details of the second detection circuit DC_2, the second adjustable ring oscillator RO_2, and the second sampling circuit SC_2 are the same as those of the first detection circuit DC_1, the first adjustable ring oscillator RO_1, and the first sampling circuit SC_1, thus are omitted for brevity here.

In other words, the control circuit 101 can dynamically adjust the setting of the first adjustable ring oscillator RO_1 via the first control signal CS_1, such that the first adjustable ring oscillator RO_1 can generate oscillation clock signals with different frequencies. The first sampling circuit SC_1 samples the oscillating clock signals with different frequencies at the same sampling frequency, so different parts of the oscillating clock signals may be sampled to generate different sampling values. Similarly, the control circuit 101 can dynamically adjust the setting of the second adjustable ring oscillator RO_2 via the second control signal CS_2, so that the second adjustable ring oscillator RO_2 can generate oscillation clock signals with different frequencies. The second sampling circuit SC_2 samples the oscillating clock signals with different frequencies at the same sampling frequency, so different parts of the oscillating clock signals may be sampled to generate different sampling values. The XOR circuit 201 generates entropy values from these sampling values. However, please note that the entropy source circuit provided by the present invention can utilize more than two groups of adjustable ring oscillators and sampling circuits to generate entropy values, and is not limited to the two groups shown in the embodiment of FIG. 2.

Figure 3:
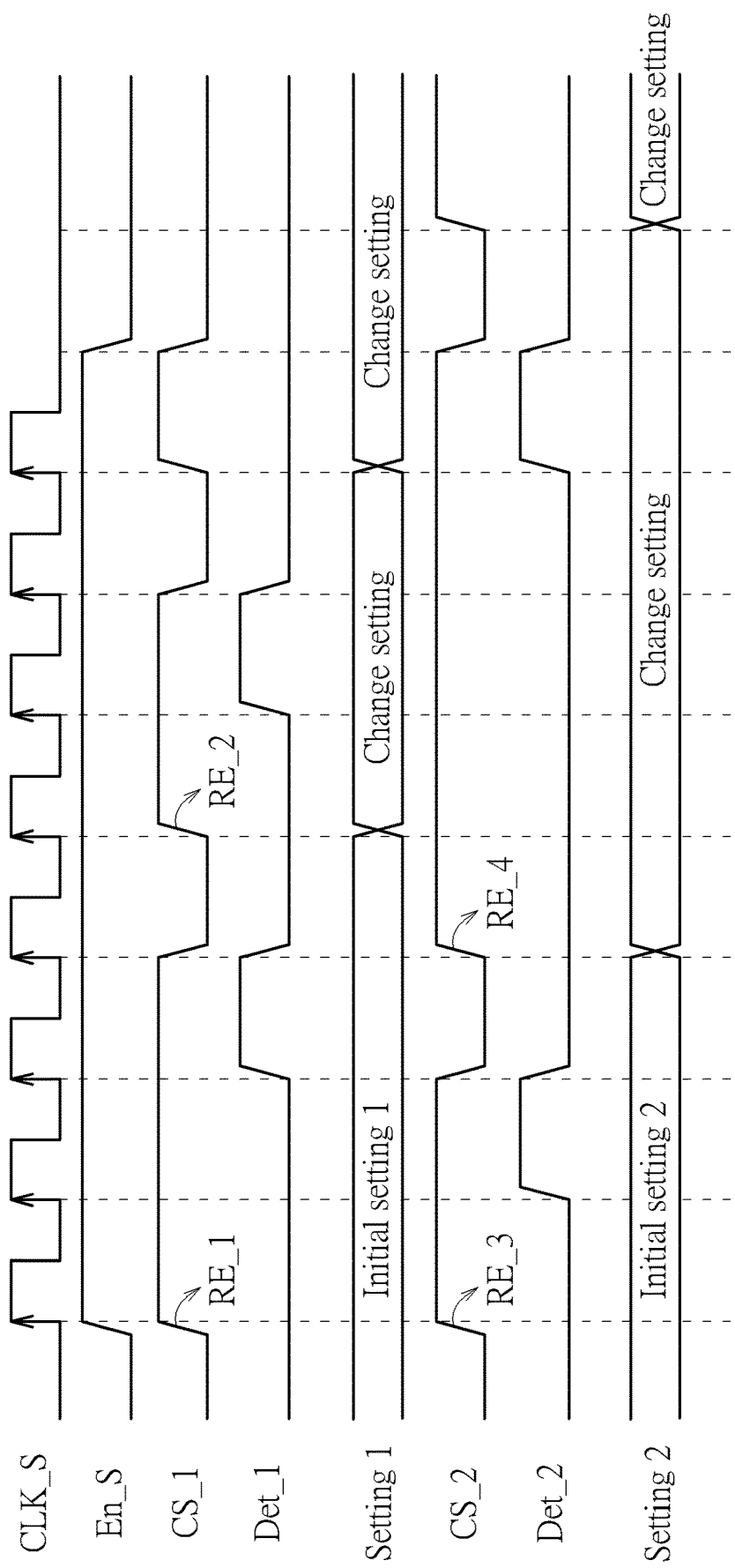
FIG. 3 is a signal wave chart for operations of the entropy source circuit in FIG. 2.

FIG. 3 is a signal wave chart for operations of the entropy source circuit in FIG. 2. In FIG. 3, the sampling clock signal CLK_S is a signal generated by the sampling clock generation circuit 103, the sampling enable signal EN_S is a signal that can enable the sampling clock generation circuit 103, and the first control signal CS_1 is a signal which the control circuit 101 uses to control the setting of the first adjustable ring oscillator RO_1. The first detection signal Det_1 is the detection result generated by the first detection circuit DC_1, and the second control signal CS_2 is a signal which the control circuit 101 uses to control the setting of the second adjustable ring oscillator RO_2. The second detection signal Det_2 is the detection result generated by the second detection circuit DC_2, the setting 1 is the setting of the first adjustable ring oscillator RO_1, and the setting 2 is the setting of the second adjustable ring oscillator RO_2.

As shown in FIG. 3, after the sampling enable signal EN_S has a high logic level (e.g., 1) to enable the sampling clock generation circuit 103, the enabling sampling clock generation circuit 103 starts to generate the sampling clock signal CLK_S. The rising edge of the first control signal CS_1 is used to switch the setting of the first adjustable ring oscillator RO_1. Therefore, in the embodiment of FIG. 3, after the first rising edge RE 1 of the first control signal CS_1 occurs, the first adjustable ring oscillator RO_1 initially operates at setting 1 since there is no previously setting. The first detection signal Det_1 is the detection result of the first detection circuit DC_1. When the first detection signal Det_1 has a low logic level (for example, 0), it means that the setting does not need to be changed, and when first detection signal Det_1 is converted to a high logic level, it means that the setting of the first adjustable ring oscillator RO_1 needs to be changed. Therefore, the first control signal CS_1 transits to a low logic level and then generate a rising edge RE_2 to trigger the change of setting 1.

The second adjustable ring oscillator RO_2 also has the same operation. Therefore, in the embodiment of FIG. 3, after the first rising edge RE_3 of the second control signal CS_2 occurs, the second adjustable ring oscillator RO_2 initially operates at the setting 2. The second detection signal Det_2 is the detection result of the first detection circuit DC_1. When the second detection signal Det_2 is at a low logic level, it means that the setting does not need to be changed, and when it is switched to a high logic level, it means that the setting of the second adjustable ring oscillator RO_2 needs to be changed. Therefore, the second control signal CS_2 transits to a low logic level and then generates a rising edge RE_4 to trigger the change of setting 2. Please also note that the embodiment shown in FIG. 3 is only used as an example and does not mean to limit the present invention, and any combination of signals that can achieve the same function should fall within the scope of the present invention.

Figure 4:
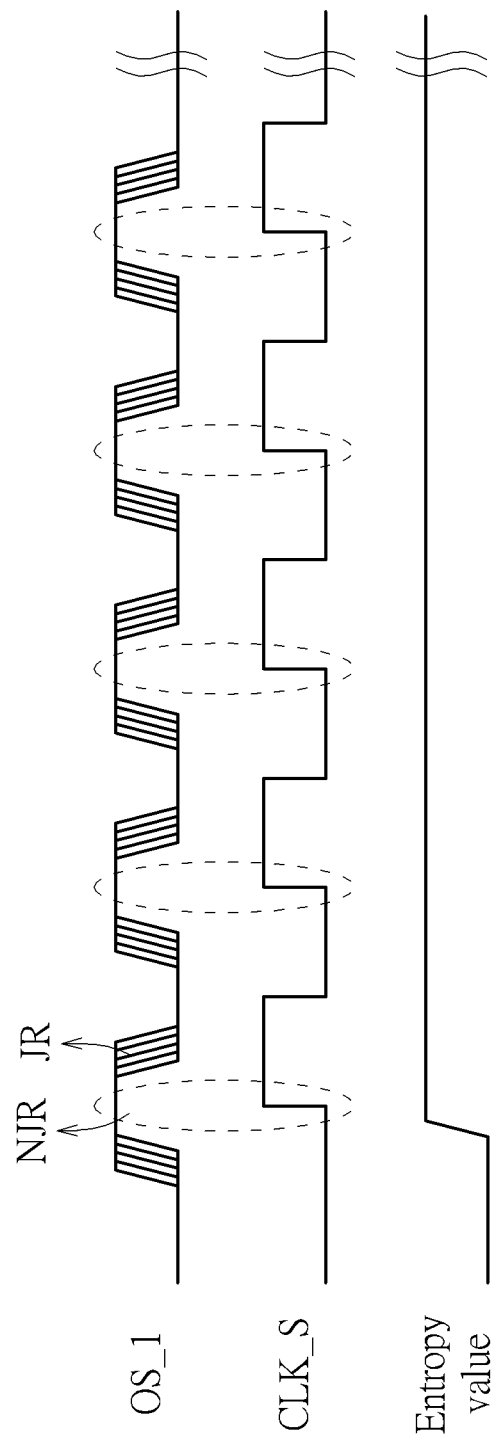
FIG. 4 is a schematic diagram illustrating how to generate entropy values with better qualities, according to one embodiment of the present invention.

FIG. 4 is a schematic diagram illustrating how to generate entropy values with better qualities, according to one embodiment of the present invention. Please also refer to FIG. 2 for a better understanding of the operations shown in FIG. 4. In the embodiment of FIG. 4, the first oscillator clock signal OS_1 is used for illustration, but the disclosed concepts can also be applied to other oscillator clock signals. As shown in FIG. 4, the high logic level portion of the first oscillation clock signal OS_1 comprises the non-jitter region NJR and the jitter region JR. In one embodiment, the non-jitter region NJR is the high logic level region of the first oscillating clock signal OS_1 and the jitter region JR is the rising edge or the falling edge of the first oscillating clock signal OS_1. The degree of jitter in the jitter region JR may be affected by the circuit process, the operating voltage or the temperature of the entropy source circuit. When most or all of the samples of the sampling clock generation circuit 103 occur in the non-jitter region NJR, the sampling values generated by the sampling clock generation circuit 103 have less variation or even are identical. If another adjustable ring oscillator (e.g., the second adjustable ring oscillator RO_2) has the same sampling state, the entropy values finally generated by the XOR circuit 201 have little or no change, that is, the entropy values with poor quality are generated.

As mentioned above, the control circuit 101 can determine if the setting of the first adjustable ring oscillator RO_1 should be changed according to the first distribution. Also, the first distribution can be: a number of a specific logic value in the first sampling values SV_1 within a predetermined time, a change rate of the first sample values SV_1, and a ratio of the number of different logic values in the first sample values SV_1. When the first detection circuit DC_1 detects that the first distribution is non-ideal (e.g., the rate of change is low), the first detection signal Det_1 is changed to a high logic level to trigger the control circuit 101 to change the setting of the first adjustable ring oscillator RO_1.

Figure 5:
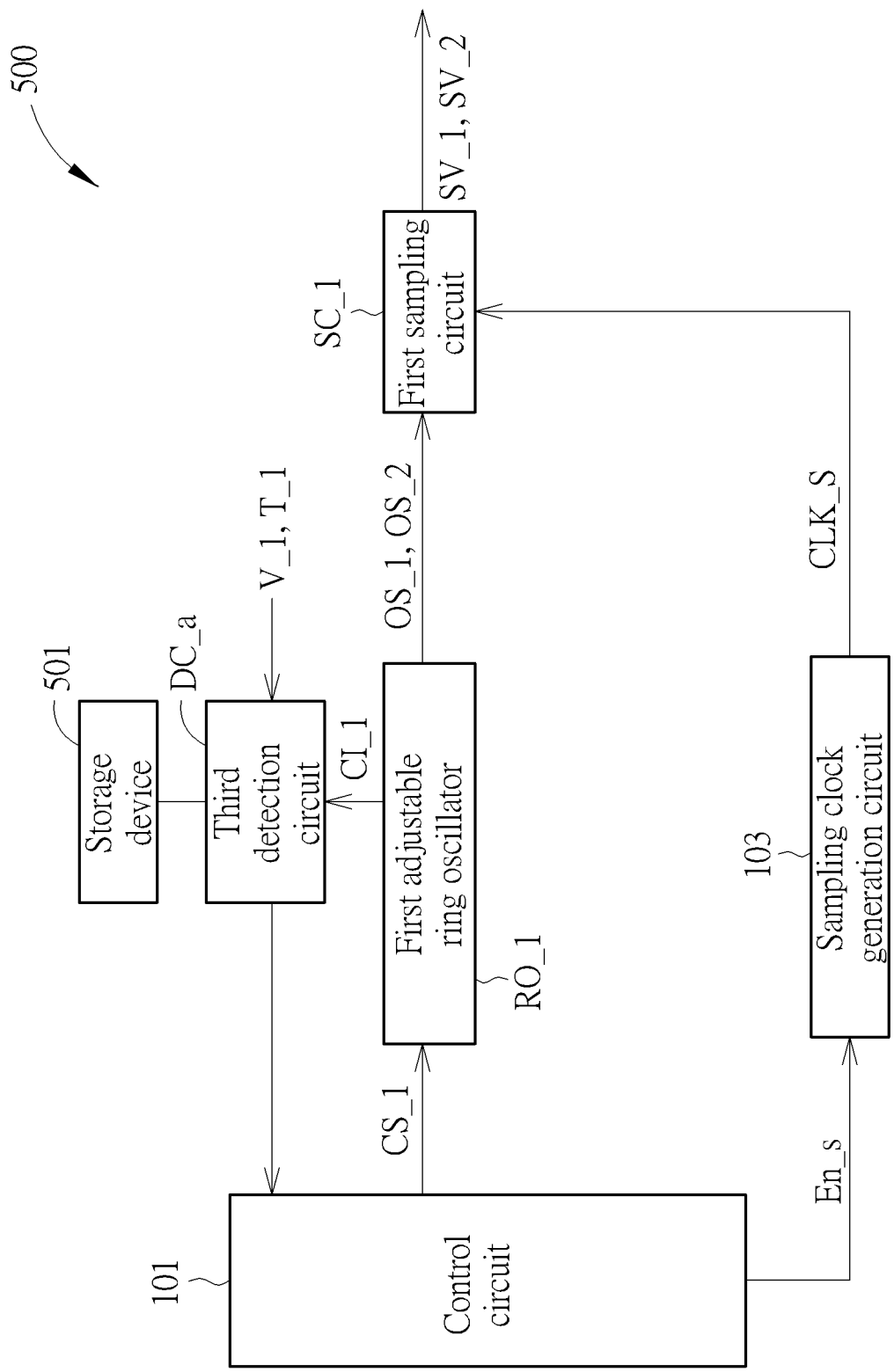
FIG. 5 and FIG. 6 are block diagrams illustrating entropy source circuits according to other embodiments of the present invention.

As mentioned above, which setting of the first adjustable ring oscillator RO_1 should be used can be determined in various ways. FIG. 5 is a block diagram illustrating an entropy source circuit according to another embodiment of the present invention, which uses a mechanism different from the previous embodiments to determine which setting should be use. As shown in FIG. 5, the entropy source circuit 500 comprises the components of the entropy source circuit 100 in FIG. 1. That is, the entropy source circuit 500 comprises the control circuit 101, the sampling clock generation circuit 103, the first adjustable ring oscillator RO_1, the first sampling circuit SC_1 and a third detection circuit DC_a. The control circuit 101 is coupled to the third detection circuit DC_a, the first adjustable ring oscillator RO_1 and the sampling clock generation circuit 103. The first sampling circuit SC_1 is coupled to the first adjustable ring oscillator RO_1 and the sampling clock generation circuit 103. The first adjustable ring oscillator RO_1 is coupled to the third detection circuit DC_a. One difference between the entropy source circuit 500 in FIG. 5 and the entropy source circuit 100 in FIG. 1 is that the third detection circuit DC_a in FIG. 5 detects a first operating voltage V_1 or a first temperature T_1 of the entropy source circuit and receives the setting information CI_1 of the first adjustable ring oscillator RO_1, instead of detecting the output of the first sampling circuit SC_1. The control circuit 101 determines which setting of the first adjustable ring oscillator OS_1 should be used according to the first operating voltage V_1 or the first temperature T_1.

In one embodiment, the entropy source circuit 500 further comprises a storage device 501 coupled to the third detection circuit DC_a. The storage device 501 is used for storing a setting comparison table, which comprises a plurality of corresponding relations of the settings, and at least one of the operating voltages and temperatures. For example, when the operating voltage is Vx, the corresponding setting is a (temperature is not considered in this example). Alternatively, when the temperature is Tx, the corresponding setting is b (the operating voltage is not considered in this example). Or when the operating voltage is Vy and When the temperature is Ty, the corresponding setting is c. The control circuit 101 selects the setting of the first adjustable ring oscillator OS_1 according to the operating voltage or the temperature and the aforementioned corresponding relationship. For example, if the control circuit 101 detects that the operating voltage is Vy and the temperature is Ty, and gets that the setting c should be used according the comparison table of the storage device 501, but gets that the first adjustable ring oscillator RO_1 is using the setting d according to the setting information CI_1. In such case, the control circuit 101 controls the first adjustable ring oscillator RO_1 to operates under the setting c via the first control signal CS_1. In one embodiment, the third detection circuit DC_a can send the first operating voltage V_1, the first temperature T_1, the setting comparison table, and the setting information CI_1 to the control circuit 101.

Figure 6:
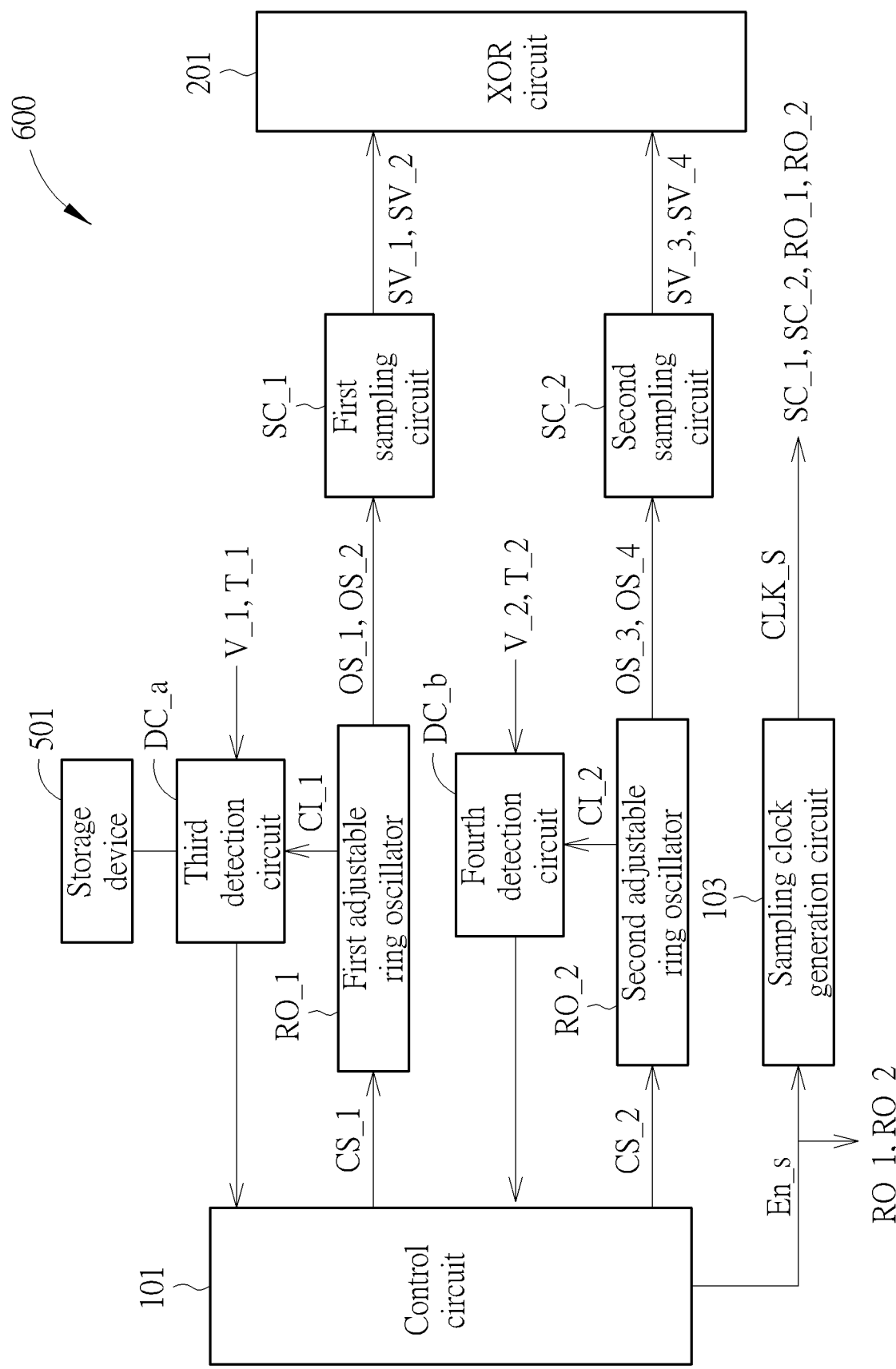

The embodiment of FIG. 5 may generate entropy values in the manner described in FIG. 2. FIG. 6 is a block diagram illustrating an entropy source circuit 600 according to another embodiment of the present invention. As shown in FIG. 6, the entropy source circuit 600 comprises a fourth detection circuit DC_b, a second adjustable ring oscillator RO_2, a second sampling circuit SC_2 and an XOR circuit 201 in addition to the components and connection relationships shown in FIG. 5. The control circuit 101 is coupled to the fourth detection circuit DC_b, the second adjustable ring oscillator RO_2 and the sampling clock generation circuit 103. The second sampling circuit SC_2 is coupled to the second adjustable ring oscillator RO_2 and the sampling clock generation circuit 103. The second adjustable ring oscillator RO_2 is coupled to the fourth detection circuit DC_b. The XOR circuit 201 is coupled to the first sampling circuit SC_1 and the second sampling circuit SC_2.

The second adjustable ring oscillator RO_2 operates under a third setting or a fourth setting according to the second control signal CS_2. The second adjustable ring oscillator RO_2 generates a third oscillation clock signal OS_3 under the third setting, and generates a fourth oscillating clock signal OS_4 under the fourth setting. The third oscillating clock signal OS_3 and the fourth oscillating clock signal OS_4 have different frequencies. The second sampling circuit SC_2 samples the third oscillating clock signal OS_3 at the sampling frequency of the sampling clock signal CLK_S to generate third sampling values SV_3, and samples the fourth oscillating clock signal at the sampling frequency of the sampling clock signal CLK_S to generate fourth sample values SV_4. The XOR circuit 201 is configured to receive the outputs of the first sampling circuit SC_1 and the second sampling circuit SC_2 to generate entropy values, that is, to generate entropy values by performing a XOR operation to the outputs of the first sampling circuit SC_1 and the second sampling circuit SC_2. The entropy source circuit 600 may further comprise a fourth detection circuit DC_b to detect the second operating voltage V_2 or the second temperature T_2 of the entropy source circuit 600. Corresponding to the different locations of the detection circuits DC_a and DC_b, the second operating voltage V_2 and the second temperature T_2 may be the same or different from the first operating voltage V_1 and the first temperature T_1 in FIG. 5. The detail operations of the fourth detection circuit DC_b, the second adjustable ring oscillator RO_2 and the second sampling circuit SC_2 are the same as those of the third detection circuit DC_a, the first adjustable ring oscillator RO_1 and the first sampling circuit SC_1, thus are omitted for brevity here.

In other words, in the embodiment of FIG. 6, the control circuit 101 can dynamically adjust the setting of the first adjustable ring oscillator RO_1 via the first control signal CS_1 according to the operating voltage or the temperature of the entropy source circuit 600, so that the first adjustable ring oscillator RO_1 generates oscillating clock signals with different frequencies. The first sampling circuit SC_1 samples the oscillating clock signals with different frequencies at the same sampling frequency, so different parts of the oscillating clock signals may be sampled to generate different sampling values. Similarly, the control circuit 101 can dynamically adjust the setting of the second adjustable ring oscillator RO_2 according to the operating voltage or the temperature of the entropy source circuit 600 via the second control signal CS_2, so that the second adjustable ring oscillator RO_2 can generate oscillating clock signals with different frequencies. The second sampling circuit SC_2 samples the oscillating clock signals of different frequencies at the same sampling frequency, so different parts of the oscillating clock signals may be sampled to generate different sampling values. The XOR circuit 201 generates entropy values from these sampling values. However, please note that the entropy source circuit provided by the present invention can utilize more than two groups of adjustable ring oscillators and sampling circuits to generate entropy values, and is not limited to the two groups illustrated in the embodiment of FIG. 2.

Figure 7:
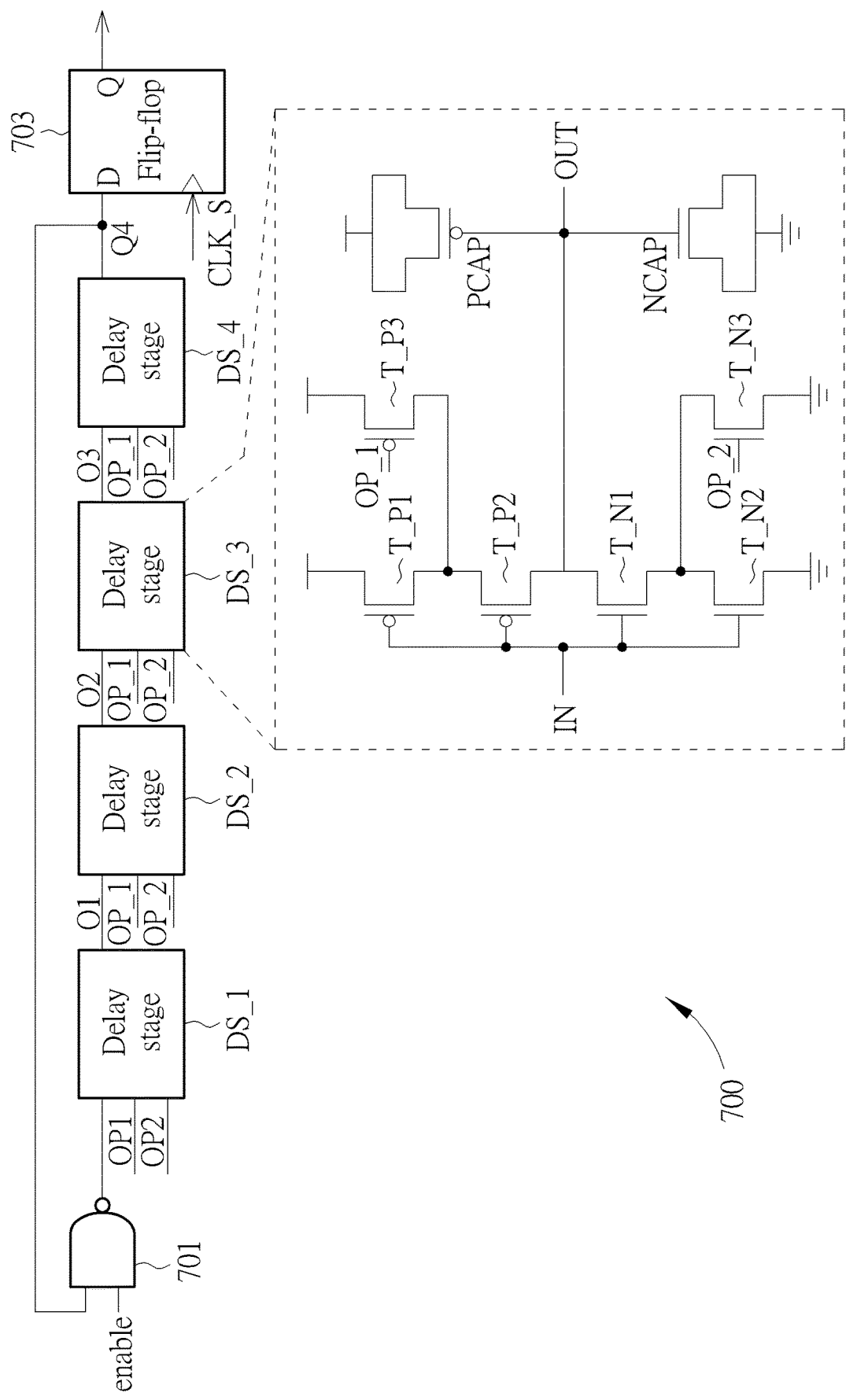
FIG. 7 is a detail circuit diagram of an adjustable ring oscillator, according to one embodiment of the present invention.

The aforementioned adjustable ring oscillator can be implemented through a variety of architectures. FIG. 7 is a detail circuit diagram of an adjustable ring oscillator, according to one embodiment of the present invention. As shown in FIG. 7, the adjustable ring oscillator 700 comprises an NAND gate 701, a plurality of delay stages DS_1, DS_2, DS_3, and DS_4 connected in series, and a flip-flop 703. The output of the NAND gate 701 is coupled to the input of the first delay stage DS_1 and the input of the NAND gate 701 is coupled to the output of the last delay stage DS_4. In one embodiment, the delay stage is an RC delay stage, and its resistance value can be changed according to the aforementioned first control signal CS_1. Please refer to FIG. 7 again, in one embodiment, the delay stages DS_1, DS_2, DS_3, and DS_4 respectively comprise PMOSs T_P1, T_P2, T_P3, P_CAP and NMOSs T_N1, T_N2, T_N3, and N_CAP. PMOSs T_P1, T_P2 and NMOSs T_N1, T_N2 are coupled series. The PMOS T_P3 is coupled to PMOSs T_P1, T_P2, and the NMOS T_N3 is coupled to PMOSs T_N1, T_N2. The PMOS T_P3 and the NMOS T_N3 receive the resistance setting signals OP_1 and OP_2 to change the resistance values of the delay stages. The PMOS P_CAP and the NMOS N_CAP are used as capacitors. For more detail, the different logic values of the resistance setting signal OP_1 can control the PMOS T_P3 to be conducted (turn on) or to be non-conducted (turn off), and the different logic values of the resistance setting signal OP_2 can control the NMOS T_N3 to be conducted (turn on) or be non-conducted (turn off). By this way, the equivalent resistance values of each delay stage DS_1, DS_2, DS_3, DS_4 can be varied to change the charging speed and the discharging speed of the capacitors PMOS P_CAP and NMOS N_CAP. Therefore, the flip-flop 703 can output oscillating clock signals OS_1, OS_2, OS_3, and OS_4 with different frequencies accordingly, so that the settings of the first adjustable ring oscillators RO_1 and RO_2 can be changed.

Figure 8:
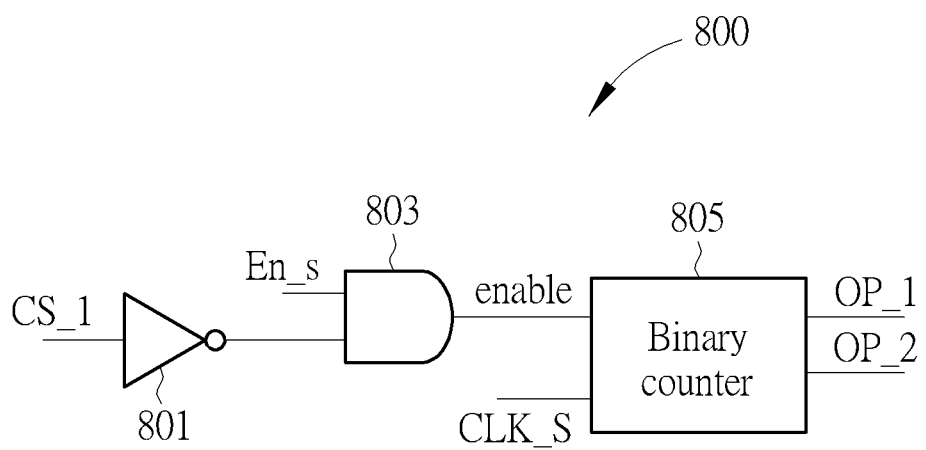
FIG. 8 is a circuit diagram of the resistance setting signal generation circuit in FIG. 7, according to one embodiment of the present invention.

In one embodiment, the adjustable ring oscillators RO_1 and RO_2 further comprise a resistance setting signal generation circuit configured to generate the resistance setting signals OP_1, OP_2 according to the first control signal CS, the sampling enable signal EN_S and the sampling clock signal CLK_S. FIG. 8 is a circuit diagram of the resistance setting signal generation circuit in FIG. 7, according to one embodiment of the present invention. As shown in FIG. 8, the resistance setting signal generation circuit 800 comprises an inverter 801, an AND gate 803 and a binary counter 805. The inverter 801 is configured to receive the first control signal CS_1. The AND gate 803 is configured to receive an output of the inverter 801 and the sampling enable signal EN_S. The binary counter 805 is configured to receive the output enable of the AND gate 803 and the sampling clock signal CLK_S to generate the resistance setting signals OP_1 and OP_2. In one embodiment, the output enable of the AND gate 803 is also used as the enable signal of the adjustable ring oscillator 700 in FIG. 7. That is, the resistance setting signal generation circuit 800 inverts the first control signal CS_1, performs an AND operation on the inverted first control signal CS_1 and the sampling enable signal EN_S, and uses the sampling clock signal CLK_S to perform the binary counting operation to the signal which is generated by a result of the AND operation, to generate resistance setting signals OP_1, OP_2. In some embodiments, according to different design requirements of the entropy source circuit, the delay stages DS_1, DS_2, DS_3, and DS_4 may have different adjustable resistance values. Therefore, the resistance setting signal may comprise other bit numbers, such as one bit, three bits or more than three bits to meet different design requirements. The binary counter 805 can also be replaced by a counter with other bits correspondingly.

Figure 9:
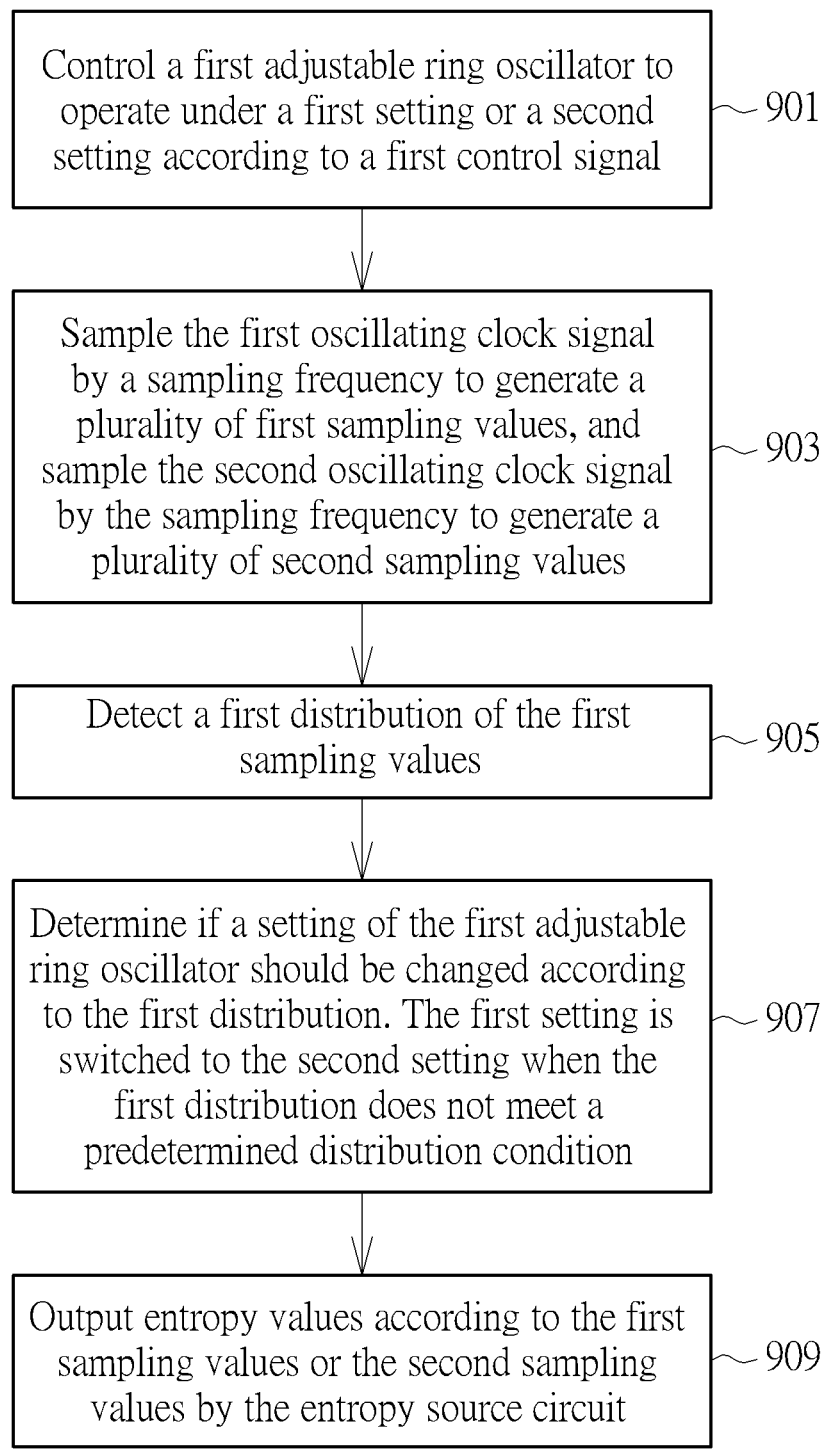
FIG. 9 is a flow chart illustrating an entropy generation method, according to one embodiment of the present invention.

According to the above-mentioned embodiments, a method for generating an entropy value can be obtained. FIG. 9 is a flow chart illustrating an entropy generation method, according to one embodiment of the present invention, which comprises the following steps:

Step 901

Control a first adjustable ring oscillator to operate under a first setting or a second setting according to a first control signal (e.g., the first control signal CS_1 in FIG. 1). The first adjustable ring oscillator generates a first oscillating clock signal under the first setting and generates a second oscillating clock signal under the second setting. The first oscillating clock signal and the second oscillating clock signal have different frequencies.

Step 903

Sample the first oscillating clock signal by a sampling frequency (such as the frequency of the sampling clock signal CLK_S in FIG. 1) to generate a plurality of first sampling values, and sample the second oscillating clock signal by the sampling frequency to generate a plurality of second sampling values;

Step 905

Detect a first distribution of the first sampling values

Step 907

Determine if a setting of the first adjustable ring oscillator should be changed according to the first distribution. The first setting is switched to the second setting when the first distribution does not meet a predetermined distribution condition Step 909

Output an entropy value according to the first sampling values or the second sampling values by the entropy source circuit.

Other detail steps or related steps have been described in the foregoing embodiments, thus are omitted for brevity here.

In view of above-mentioned embodiments, the entropy source circuit and the entropy value generation method provided by the present invention can dynamically change the frequency of the oscillating clock signal to ensure that entropy values with better qualities can be generated at any time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An entropy source circuit, comprising:
a first adjustable ring oscillator, configured to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies;
a first sampling circuit, configured to sample the first oscillating clock signal by a sampling frequency to generate a plurality of first sampling values, and configured to sample the second oscillating clock signal by the sampling frequency to generate a plurality of second sampling values;
a first detection circuit, configured to detect a first distribution of the first sampling values;
a control circuit, configured to determine if a setting of the first adjustable ring oscillator should be changed according to the first distribution, wherein the control circuit generates the first control signal to switch the first setting to the second setting when the first distribution does not meet a predetermined distribution;
a second adjustable ring oscillator, configured to operate under a third setting or a fourth setting according to a second control signal, wherein the second adjustable ring oscillator generates a third oscillating clock signal under the third setting and generates a fourth oscillating clock signal under the fourth setting, wherein the third oscillating clock signal and the fourth oscillating clock signal have different frequencies;

a second sampling circuit, configured to sample the third oscillating clock signal by the sampling frequency to generate a plurality of third sampling values, and configured to sample the fourth oscillating clock signal by the sampling frequency to generate a plurality of fourth sampling values;

a second detection circuit, configured to detect a second distribution of the third sampling values, wherein the control circuit determines if a setting of the second adjustable ring oscillator should be changed according to the second distribution of the third sampling values, wherein the control circuit generates the second control signal to switch the third setting to the fourth setting when the second distribution does not meet the predetermined distribution; and an XOR circuit, configured to generate entropy values according to the first sampling values, the second sampling values, the third sampling values or the fourth sampling values;

wherein the entropy source circuit outputs the generated entropy values.

2. The entropy source circuit of claim 1, wherein the first distribution comprises:

a number of a specific logic value of the first sampling values, a variation rate of the first sampling values, or a ratio of numbers of different logic values in the first sampling values.

3. The entropy source circuit of claim 1, wherein the first detection circuit applies Repetition Test or Adaptive Proportion Test, which follows a SP800-90B standard, to detect the first distribution.

4. The entropy source circuit of claim 1, wherein the first adjustable ring oscillator comprises a plurality of RC delay stages, and the first control signal is used for changing resistance values of the RC delay stages.

5. An entropy source circuit, comprising:

a first adjustable ring oscillator, configured to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies;

a first sampling circuit, configured to sample the first oscillating clock signal by a sampling frequency to generate a plurality of first sampling values, and configured to sample the second oscillating clock signal by the sampling frequency to generate a plurality of second sampling values;

a third detection circuit, configured to detect a first operation voltage or a first temperature of the entropy source circuit;

a control circuit, configured to determine if a setting of the first adjustable ring oscillator should be changed from the first setting to the second setting according to the first operation voltage or the first temperature; and a storage device, configured to store a setting mapping table, wherein the setting mapping table comprises a plurality of corresponding relations of operation voltage, temperatures and settings, wherein the control circuit selects a setting of the first adjustable ring oscillator according to the first operation voltage or the first temperature, and according to the corresponding relations;

wherein the entropy source circuit outputs entropy values according to the first sampling values or the second sampling values.

6. The entropy source circuit of claim 5, wherein the first adjustable ring oscillator comprises a plurality of RC delay stages, and the first control signal is used for changing resistance values of the RC delay stages.

7. The entropy source circuit of claim 6, further comprising:

a sampling clock generation circuit, configured to generate a sampling clock signal with the sampling frequency, wherein the control circuit generates a sampling enable signal to enable the sampling clock generation circuit;

wherein the first adjustable ring oscillator comprises:

a resistance setting signal generation circuit, configured to generate a resistance setting signal to change the resistance value according to the first control signal, the sampling enable signal and the sampling clock signal.

8. The entropy source circuit of claim 7, wherein the resistance setting signal generation circuit comprises:

an inverter, configured to receive the first control signal;

an AND gate, configured to receive an output of the inverter and the sampling enable signal; and a counter, configured to receive an output of the AND gate and the sampling enable signal, to generate the resistance setting signal.

9. An entropy source circuit comprising:

a first adjustable ring oscillator, configured to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies;

a first sampling circuit, configured to sample the first oscillating clock signal by a sampling frequency to generate a plurality of first sampling values, and configured to sample the second oscillating clock signal by the sampling frequency to generate a plurality of second sampling values;

a third detection circuit, configured to detect a first operation voltage or a first temperature of the entropy source circuit; and a control circuit, configured to determine if a setting of the first adjustable ring oscillator should be changed from the first setting to the second setting according to the first operation voltage or the first temperature;

a second adjustable ring oscillator, configured to operate under a third setting or a fourth setting according to a second control signal, wherein the second adjustable ring oscillator generates a third oscillating clock signal under the third setting and generates a fourth oscillating clock signal under the fourth setting, wherein the third oscillating clock signal and the fourth oscillating clock signal have different frequencies;

a second sampling circuit, configured to sample the third oscillating clock signal by the sampling frequency to generate a plurality of third sampling values, and configured to sample the fourth oscillating clock signal by the sampling frequency to generate a plurality of fourth sampling values;

a fourth detection circuit, configured to detect a second operation voltage or a second temperature of the entropy source circuit, wherein the control circuit, determines if a setting of the second adjustable ring oscillator should be changed from the third setting to the fourth setting according to the second operation voltage or the second temperature; and an XOR circuit, configured to output the entropy value further according to the third sampling values or the fourth sampling values.

10. An entropy value generation method, applied to an entropy source circuit, comprising:

controlling a first adjustable ring oscillator to operate under a first setting or a second setting according to a first control signal, wherein the first adjustable ring oscillator generates a first oscillating clock signal under the first setting and generates a second oscillating clock signal under the second setting, wherein the first oscillating clock signal and the second oscillating clock signal have different frequencies;

sampling the first oscillating clock signal by a sampling frequency to generate a plurality of first sampling values, and sampling the second oscillating clock signal by the sampling frequency to generate a plurality of second sampling values;

detecting a first distribution of the first sampling values;

determining if a setting of the first adjustable ring oscillator should be changed according to the first distribution, where in the first setting is switched to the second setting when the first distribution does not meet a predetermined distribution;

outputting entropy values according to the first sampling values or the second sampling values by the entropy source circuit;

generating a sampling clock signal with the sampling frequency by a sampling clock generation circuit, and generating a sampling enable signal to enable the sampling clock generation circuit; and generating a resistance setting signal to change a resistance value of RC delay stages of the first adjustable ring oscillator according to the first control signal, the sampling enable signal and the sampling clock signal.

11. The entropy value generation method of claim 10, wherein the first distribution comprises:

a number of a specific logic value of the first sampling values, a variation rate of the first sampling values, or a ratio of numbers of different logic values in the first sampling values.

12. The entropy value generation method of claim 10, wherein the step of detecting a first distribution applies Repetition Test or Adaptive Proportion Test, which follows a SP800-90B standard, to detect the first distribution.

13. The entropy value generation method of claim 10, further comprising:

controlling a second adjustable ring oscillator to operate under a third setting or a fourth setting according to a second control signal, wherein the second adjustable ring oscillator generates a third oscillating clock signal under the third setting and generates a fourth oscillating clock signal under the fourth setting, wherein the third oscillating clock signal and the fourth oscillating clock signal have different frequencies;

sampling the third oscillating clock signal by the sampling frequency to generate a plurality of third sampling values, and sampling the fourth oscillating clock signal by the sampling frequency to generate a plurality of fourth sampling values;

detecting a second distribution of the third sampling values, determining if a setting of the second adjustable ring oscillator should be changed according to the second distribution of the third sampling values, where in the third setting is switched to the fourth setting when the second distribution does not meet the predetermined distribution; and applying an XOR circuit to generate the entropy values further according to the third sampling values or the fourth sampling values.

14. The entropy value generation method of claim 10, wherein the step of changing a resistance value comprises:

inverting the first control signal;

performing an AND operation on an inverted signal of the first control signal and the sampling enable signal; and performing a binary counting operation to a signal which is generated by a result of the AND operation, to generate the resistance setting signal.

* * * * *